United States Patent [19]

Longway et al.

[11] Patent Number: 5,440,506

[45] Date of Patent: Aug. 8, 1995

[54] SEMICONDUCTOR ROM DEVICE AND METHOD

[75] Inventors: Charles W. T. Longway; William R. Young, both of Palm Bay, Fla.

[73] Assignee: Harris Corporation, Melbourne, Fla.

[21] Appl. No.: 930,930

[22] Filed: Aug. 14, 1992

[51] Int. Cl.⁶ ............................................. G11C 17/00
[52] U.S. Cl. ................... 365/104; 365/189.09; 365/207; 365/203; 365/226
[58] Field of Search .............. 365/189.09, 203, 207, 365/104, 226, 230.06, 231, 185, 104

[56] References Cited

U.S. PATENT DOCUMENTS

| 4,342,102 | 7/1982 | Puar | 365/207 |
|---|---|---|---|
| 4,599,704 | 7/1986 | Mazin | 365/104 |
| 4,692,902 | 9/1987 | Tanaka et al. | 365/210 |
| 4,899,315 | 2/1990 | Houston | 365/230.06 |
| 5,018,103 | 5/1991 | Pomper et al. | 365/104 |
| 5,134,588 | 7/1992 | Kubota et al. | 365/207 |
| 5,148,397 | 9/1992 | Kokubun | 365/189.09 |

Primary Examiner—Eugene R. LaRoche
Assistant Examiner—Huan Hoang
Attorney, Agent, or Firm—Rogers & Killeen

[57] ABSTRACT

Integrated circuit memory with bitlines which cross each other in multiple place for symmetric capacitives coupling. Also read only memory with differential sense amplifier with an input to each half array of cells. Bits are stored complementarily in the two halves.

18 Claims, 13 Drawing Sheets

SEMICONDUCTOR ROM DEVICE AND METHOD

BACKGROUND AND SUMMARY OF THE INVENTIONS

The present invention relates to electronic devices, and, more particularly, to semiconductor memory circuits.

Memory circuits

Figure 1:
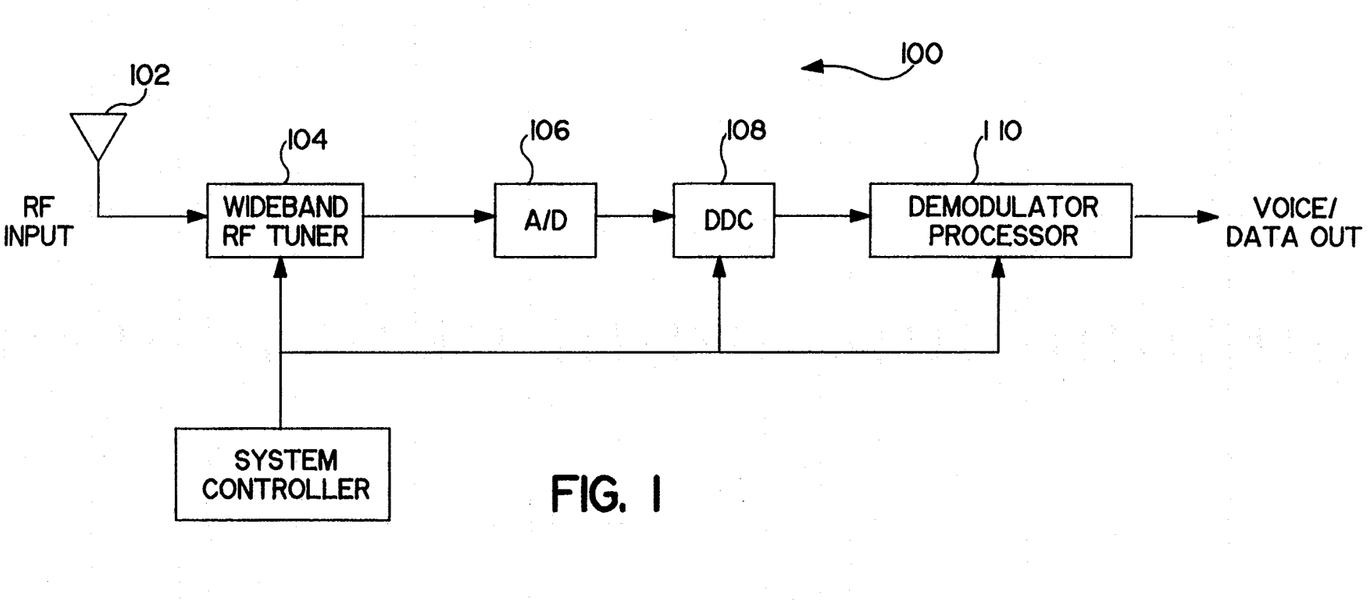
FIG. 1 illustrates a communication system application.
Figure 2:
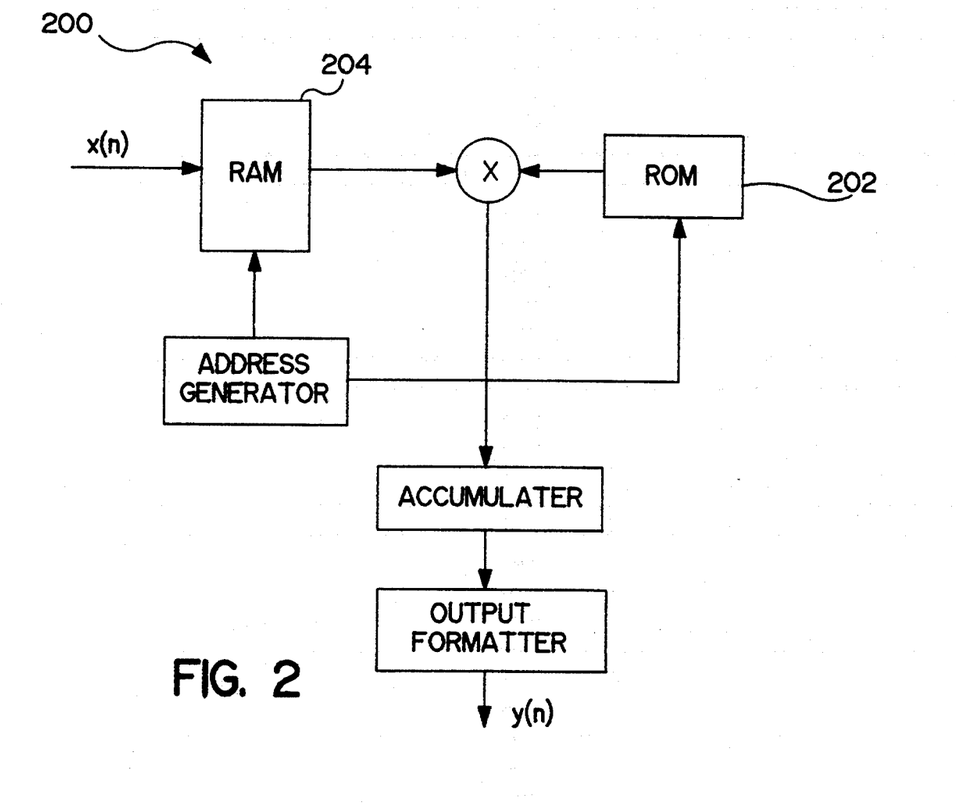
FIG. 2 shows a filter with RAM and ROM.

As is well known, digital computers use digital semiconductor primary memory and typically also have digital magnetic secondary memory. The primary memory stores current data and programs, and the secondary memory provides bulk storage. But other electronic systems also use memory in various ways. For example, in communication systems the use of frequency division multiplexing (FDM) to simultaneously broadcast differing information signals from several sources in a single locale requires a receiver be able to extract a desired information signal from a received broadband of simultaneous broadcasts. See schematic FIG. 1. Such extraction typically includes sampling of the received signal to form a digital signal (A/D converter 106) and then digital signal processing (digital down converter 108) to recover the desired information signal. The digital signal processing will use digital filtering following a mixing down (down conversion by the selected carrier frequency). The digital filtering often requires multiplications of filter coefficients with data samples, and typically the filter coefficients are stored in semiconductor read only memory (ROM) and the data samples temporarily stored in semiconductor random access memory (RAM). FIG. 2 illustrates a finite impulse response filter incorporating ROM 202 storing filter coefficients and dual port RAM 204 storing the data samples. These memories must be both fast due to high communication frequencies and low power due to the portable nature of much communication systems.

Features

The present invention provides semiconductor memory with differential sensing and low capacitance layouts in both RAM and ROM for speed and low power.

It also provides self timed interface which allows memories to operate at optimum speed without requiring on chip glue logic to interface with the rest of a design.

BRIEF DESCRIPTION OF THE DRAWINGS

The present invention will be described with reference to the accompanying drawings, which are schematic for clarity:

FIG. 10a is a ROM memory cell layout showing metal 1, metal 2, via 1, and via 2 layers;

FIG. 10b is a ROM memory cell layer showing metal 1, via 1, poly and diffusion layers;

FIG. 10a–d are ROM memory cell layouts showing all layers.

DESCRIPTION OF THE PREFERRED EMBODIMENTS

Figure 3A:
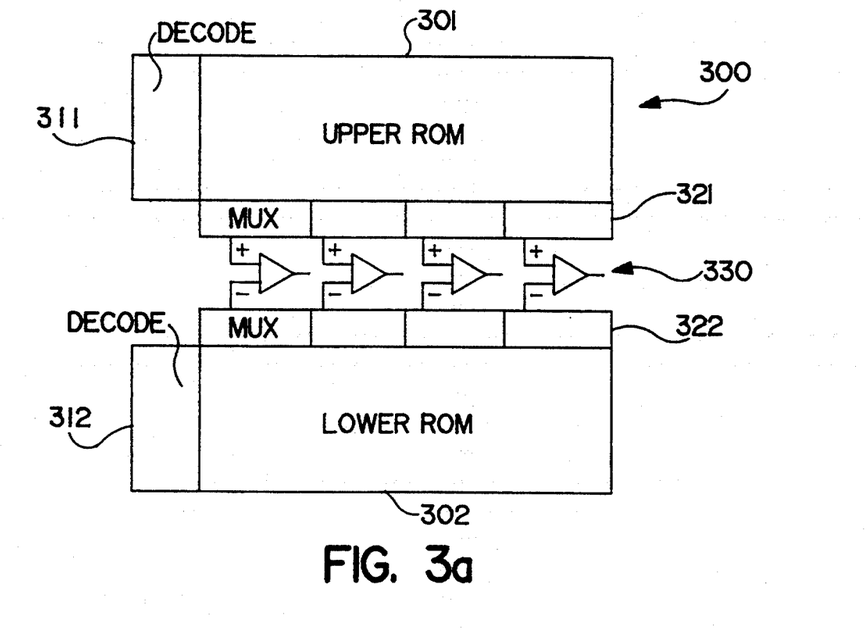
FIGS. 3a–b are functional block diagrams of a first preferred embodiment differential ROM.

FIG. 3a is a functional block circuit diagram of a first preferred embodiment read only memory (ROM), generally denoted by reference numeral 300, which includes upper ROM cells 301, lower ROM cells 302, address decoder 311 for upper ROM 301, address decoder 312 for lower ROM 302, column multiplexers 321 and 322, and differential sense amplifiers 330. As described in detail in the following, ROM 300 operates with differential sensing in that sense amplifiers 330 are differential amplifiers with their positive inputs coupled to columns in upper ROM 301 and their negative inputs coupled to columns in lower ROM 302. ROM 300 may be a portion of an integrated circuit containing other circuits sharing power and ground connections. The columns each have a reference cell, so if a cell in upper ROM 301 is to be read, then the reference cell in the corresponding column in lower ROM 302 provides the complementary input to the sense amplifier. FIG. 3a also shows four sense amplifiers 330, so ROM 300 could be set up to read out four bits in parallel. Each sense amplifier 330 is multiplexed to a number of columns by column multiplexers 321 and 322.

Figure 3B:
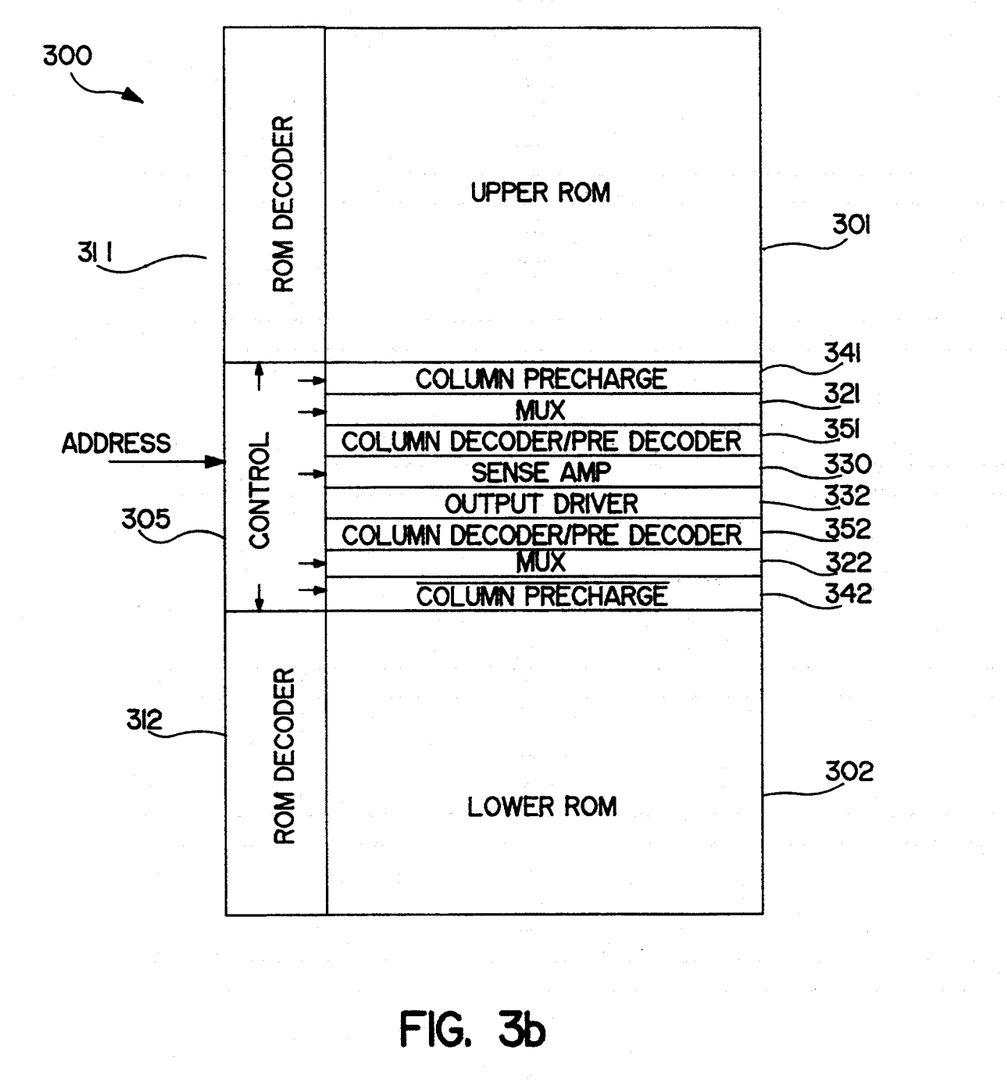

FIG. 3b provides another functional circuit diagram of ROM 300 with further details: control circuitry 305 which generates timing and partitions an incoming address into row and column bits, sense amplifier output drivers 332, column prechargers 341-342, and column decoders 351-352.

Figure 4A:
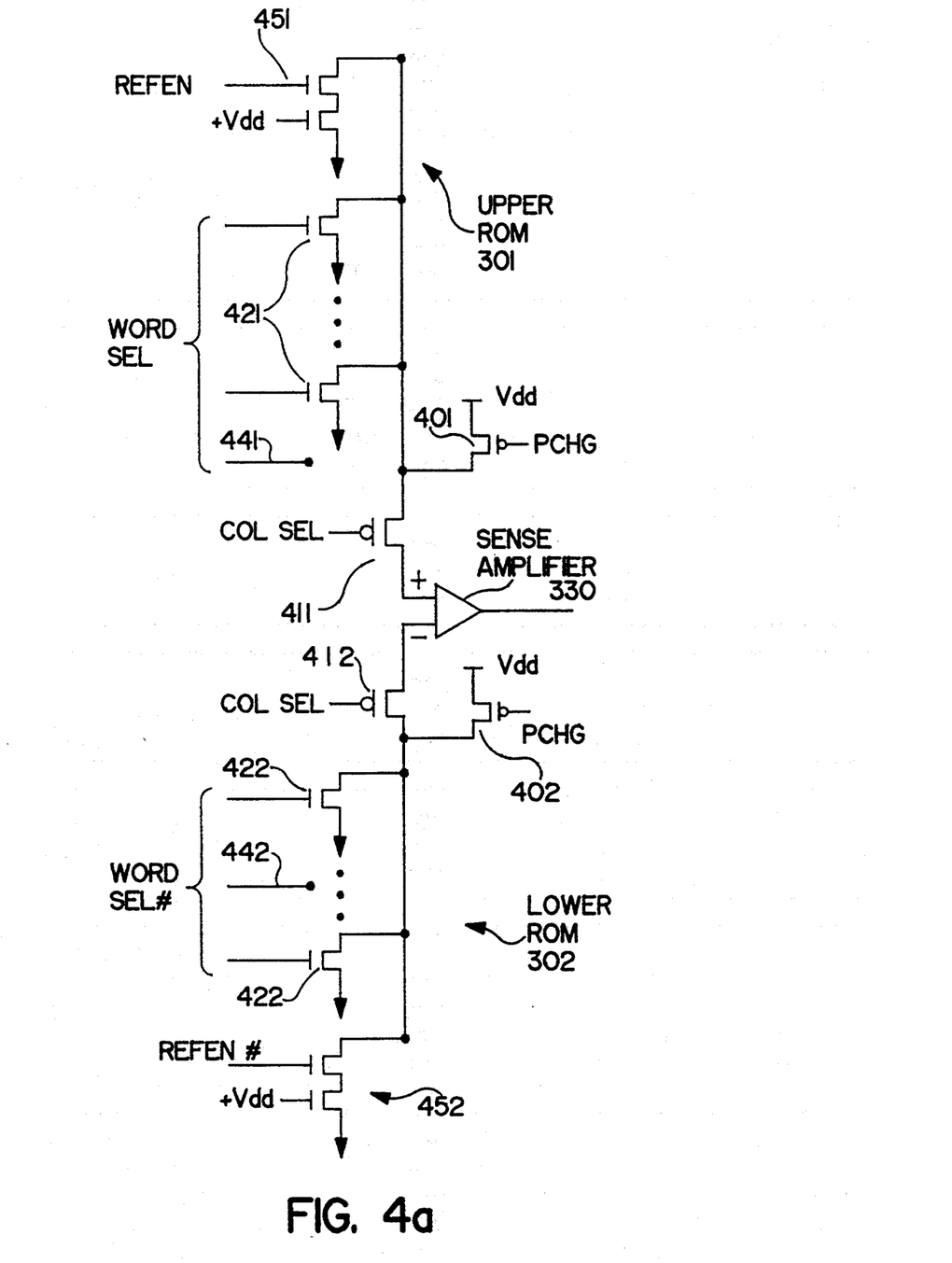
FIGS. 4a–b schematically show a column and power distribution in the first preferred embodiment ROM.

ROM 300 provides high speed, low power sensing by using a differential sense amplifier as is typical in a RAM rather than the typical single-ended sense amplifier of a ROM. FIG. 4a schematically details a single column and cells from upper ROM 301 and lower ROM 302 with sense amplifier 330 coupled to the column ends; multiplexing is omitted for clarity. The columns include precharge pullup PMOS devices 401-402, column select PMOS pass devices 411-412, a number of cell NMOS devices 421-422, and reference cells 451-452 each made of an NMOS device in series with a second NMOS device which has its gate tied to the supply voltage Vdd. In upper ROM 301, a cell stores a 0 by the presence of an NMOS device 421 connecting the column to ground and stores a 1 by the absence of an NMOS device indicated by the line 441 terminating without an NMOS 421. In lower ROM 302 a cell stores a 0 by the absence of an NMOS device such as line 442 and stores a 1 by the presence of an NMOS device 422. This asymmetry reflects the sense amplifier's positive and negative inputs with the positive input connecting to the upper ROM 301 column and the negative input connecting to the lower ROM 302 column. Because the reference cells have two NMOS devices in series, the reference cells have only half of the drive current of the other cells with NMOS devices present: all of the cell NMOS devices have the same gate width to length ratio.

Figure 5A:
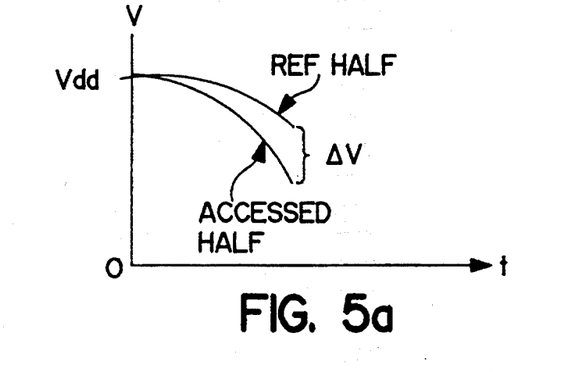
FIGS. 5a–b show sensing in the first preferred embodiment ROM.
Figure 5B:
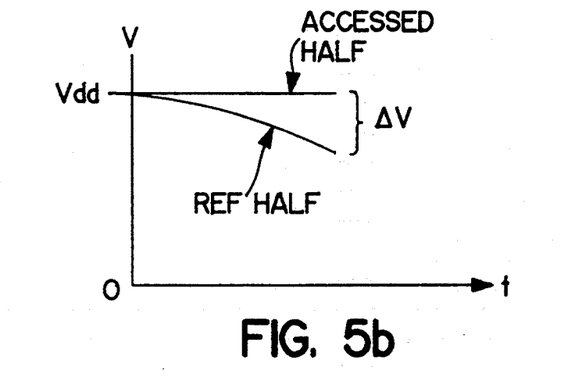

FIGS. 5a-b heuristically illustrates the operation of sense amplifiers 330 in ROM 300 as follows. First, the columns are precharged to Vdd by PCHG going low turning on PMOS pull ups 401-402 in each column. During this precharging the column select PMOS 411-412 are turned off to isolate the columns from the sense amplifiers. Next, the appropriate column selects are turned on and a cell is accessed on one column by driving the cell's wordline high, and simultaneously turning on the reference cell in the other column. In particular, if the signal Word_Sel goes high to access an upper ROM cell, then signal Refen# (# denotes complement) goes high to turn on reference cell 452 in lower ROM; and if Word_Sel# goes high to access a cell in lower ROM, then Refen goes high to turn on reference cell 451 in upper ROM. If the cell accessed has an NMOS device present (storing a 0 in the upper ROM or a 1 in the lower ROM), then voltage on the column containing the accessed cell will drop from Vdd towards ground when the NMOS device (421 or 422) turns on. Similarly, the voltage of the other column will also drop from Vdd towards ground as the reference cell (451 or 452) turns on. Now the voltage of the column with the accessed cell will drop at twice the rate that the voltage on the other column drops due to the reference cell having only one half of the drive current. FIG. 5a shows the two column voltages dropping and the voltage differential $\Delta V$ seen by sense amplifier 330.

Conversely, if the accessed cell does not have an NMOS device present (storing a 1 in the upper ROM or a 0 in the lower ROM), then the voltage on the column containing the accessed cell does not drop toward ground because nothing turns on to pull it down. But the reference cell in the other column turns on and pulls the voltage towards ground; see FIG. 5b again showing the differential voltage $\Delta V$ seen by sense amplifier 330 but with opposite polarity from the case of FIG. 5a.

The two rows of reference cells have NMOS devices in every column, whereas the rows of cells storing data only have NMOS devices in the columns with the corresponding bit (0 in upper ROM, 1 in lower ROM) and on the average only load the corresponding wordline with half the device capacitance. (The parasite capacitance is approximately equal.) Thus the reference rows are a worst case for row turn-on timing, and the sense amplifier strobe is driven by the reference cell row wordline rise. Also, the reference cells 451-452 are placed at the end of each column away from the sense amplifier, and the Vdd power connections (precharge pull up PMOS devices 401-402) are placed near the sense amplifier 330 in order to avoid any parasitic differential voltages. That is, FIG. 4a correctly portrays the device ordering along a column.

Figure 4B:
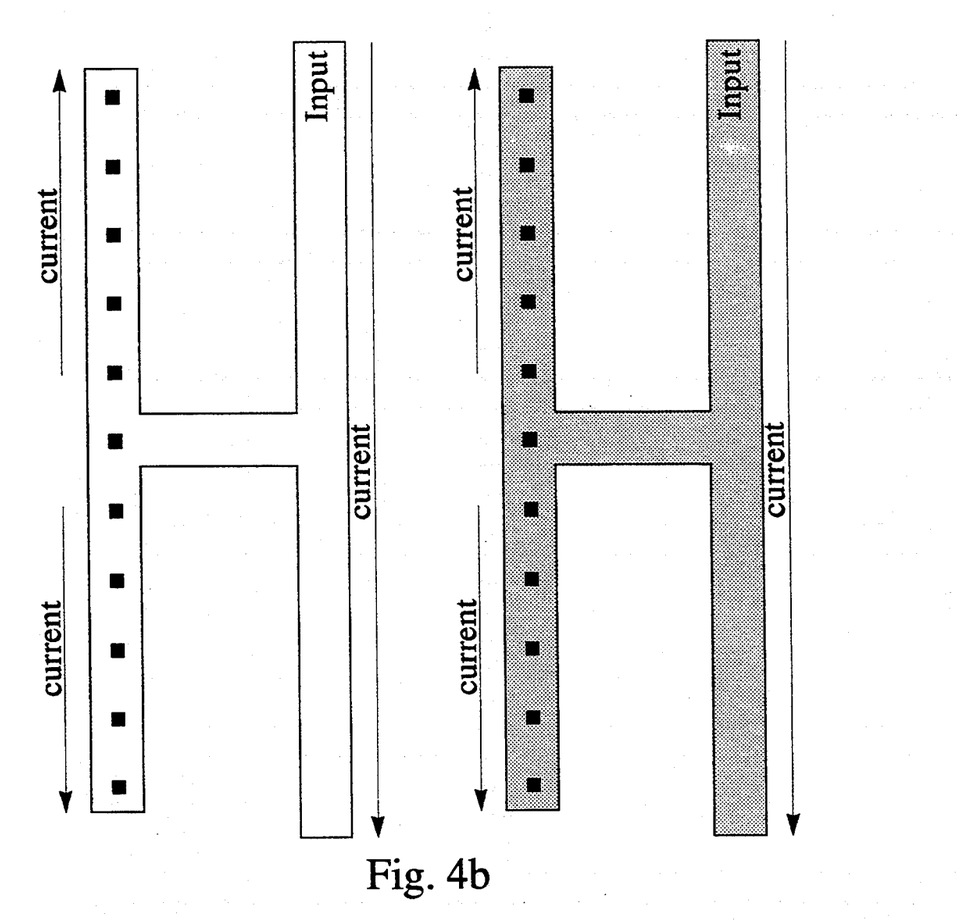

FIG. 4b further illustrates the power distribution in ROM 300. In particular, in a differential ROM a bit and its complement (reference column) are on opposite sides of the memory array. To avoid power supply voltage drops, which may affect the differential inputs to the sense amplifier, ROM 300 distributes the power in such a way that the same voltage is applied to similar circuits on both halves of the column logic and memory array. The "H" shaped power distribution shown in FIG. 4b is repeated every sixteen columns. The black squares indicate contacts for distribution to other layers for local power distribution. Because power flows from the center of the "H" to symmetric distribution points the amount of current flowing through the input of the "H" has no differential affect on what voltage is distributed.

This allows power to flow over the memory array and into other logic on an integrated circuit which includes the memory array as a subcircuit without concern for voltage drops across the array. The shaded supply is Vdd and the unshaded supply is ground. The "H" pattern is continuous in third level metal and the distribution to ground through the array is in first level metal connected to the distribution side of the "H" pattern.

Figure 6A:
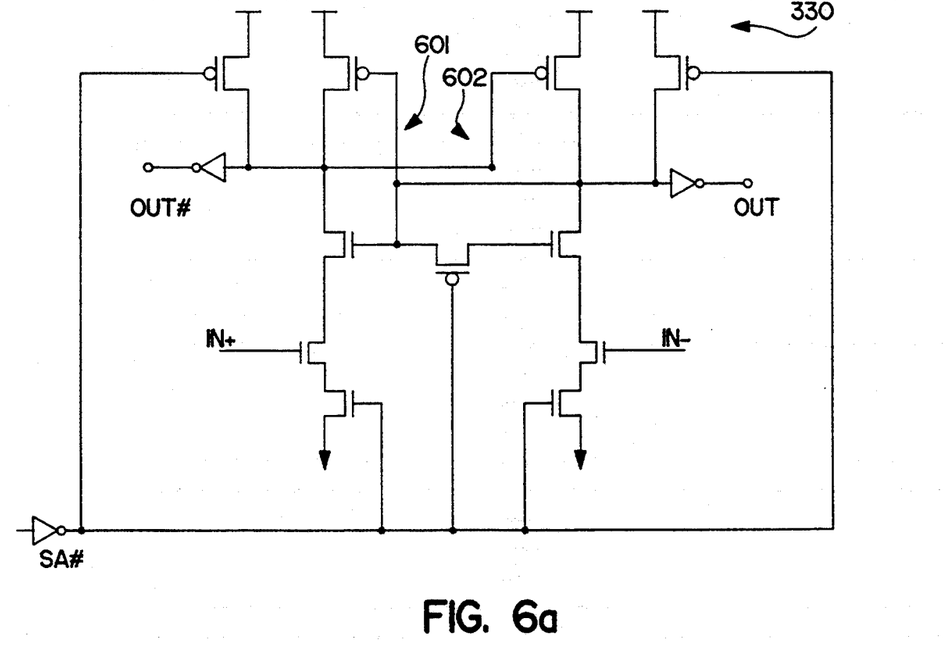
FIGS. 6a–b are schematic circuit diagrams for the sense amplifier with an output buffer of the first preferred embodiment ROM.
Figure 6B:
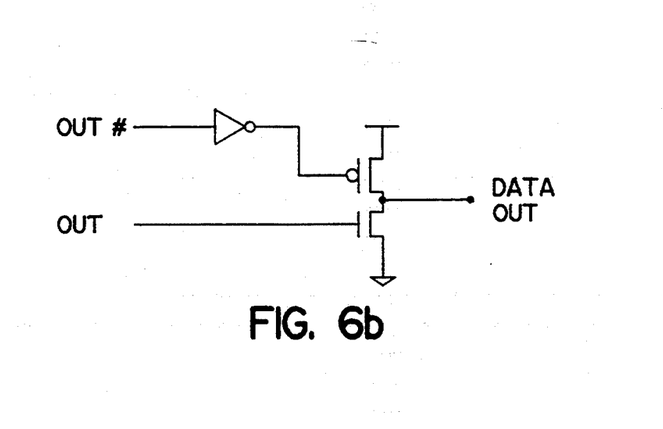
Figure 7:
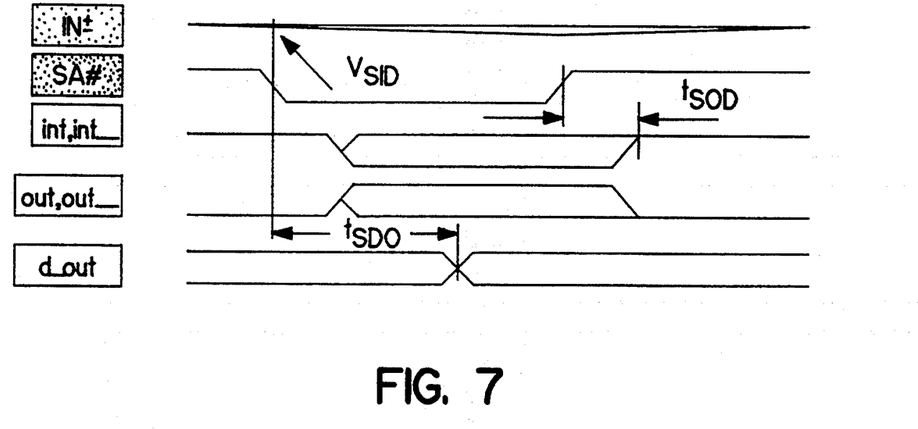
FIG. 7 is a ROM sense amplifier timing diagram.

FIG. 6a schematically shows sense amplifier 330 with an output buffer in FIG. 6b. Sense amplifier 330 uses cross-coupled inverters 601-602 to amplify the differential input signals at IN+ and IN−. Sense amplifier strobe signal SA# goes high to precharge sense amplifier 330 and goes low to activate it. FIG. 7 is a timing diagram illustrating the operation of sense amplifier 330. The top panel of FIG. 7 shows the voltage at one of the differential inputs IN+, IN−; the second panel is the sense amplifier strobe signal SA# which goes low to activate the sense amplifier. The third panel shows the voltage at the inputs/outputs of the cross-coupled inverters 601-602 which latch the bit being read. The fourth panel shows the sense amplifier outputs to the output buffer, and the bottom panel shows the data output of the output buffer. Note that SA# turns on the sense amplifier when the columns (inputs IN+, IN−) have only partially discharged; this reduces the power consumed in reading and precharging.

Figure 8:
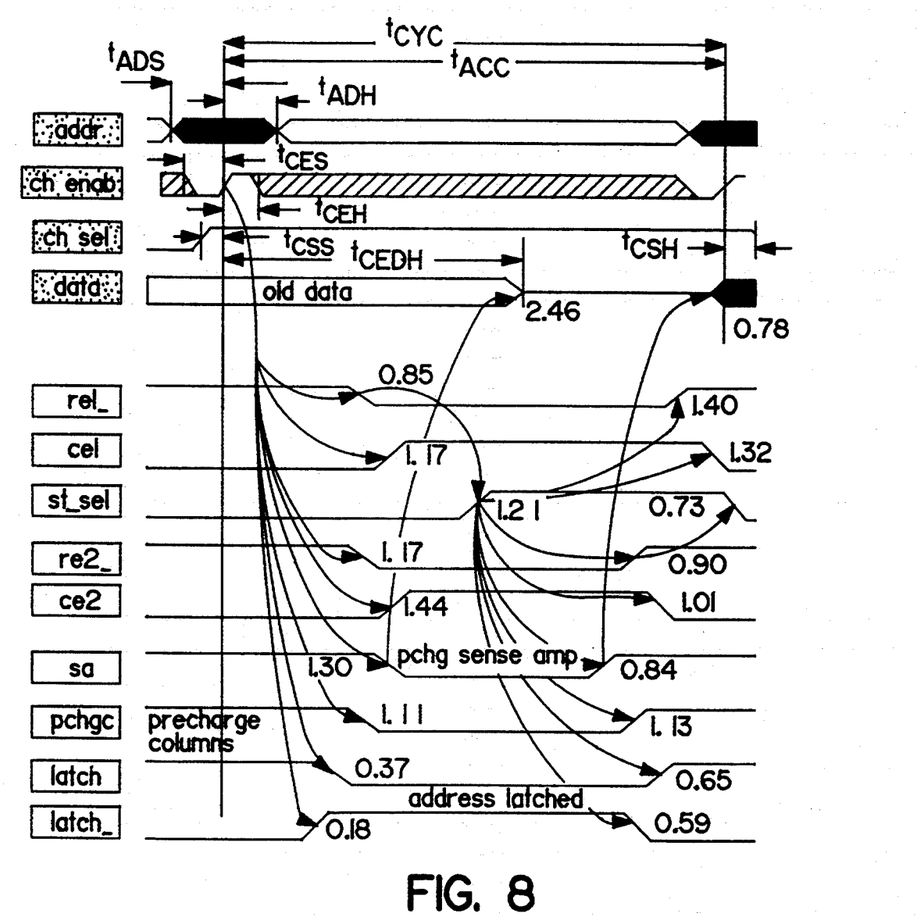
FIG. 8 is the top level timing diagram.

FIG. 8 is a timing diagram illustrating the overall operation of ROM 300. A read cycle starts when the Chip Enable signal goes high (second panel of FIG. 8). The address registers latch the values that are at the address inputs when the cycle starts; the top panel shows that the address must be valid when the cycle starts. Also, the third panel shows the Chip Select signal high to permit access. The least significant bit of row address is used to select which of upper ROM and lower ROM should be used as the reference cell. The state of Chip Enable is self latched. During a cycle signal Self-timed Row Select (seventh panel) drives Sense Amplifier Strobe (SA, tenth panel) to activate sense amplifier 330 and put the accessed bit out at Data (fourth panel). The row and column drivers (Word_Sel and Col_Sel in FIG. 4 and panels 5-6 and 8-9 in FIG. 8) are shut down at the same time that sense amplifier 330 is activated. The Self-Timed Row Select signal (panel 7 in FIG. 8) resets the latched state of Chip Enable which in turn opens up the address latch (bottom two panels). Subsequently, the column and row logic are precharged (eleventh panel).

Figure 9:
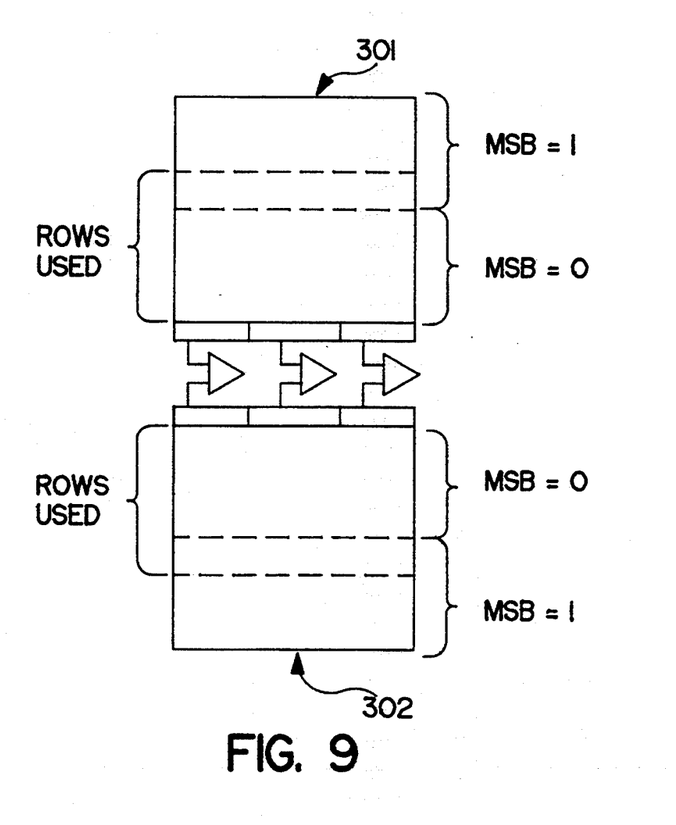
FIG. 9 illustrate storage with incomplete usage of address space.

FIG. 9 shows ROM 300 when not all of the address space is used for storage. In all cases the row corresponding to a "1" in the most significant bit of the row address is disposed symmetrically from bottom to top and top to bottom in 301 and 302 respectively. When the number of words used is less than $2^{MSB(row)}$ then MSB=1 will address the same number of words on each side of the array (301, 302) but less than $2^{MSB(row)}-1$ total words. In this case, the most significant bit (MSB) of the address is symmetrically disposed to balance the column loadings. The least significant bit of row space (LSB) is used to determine upper ROM versus lower ROM.

Figure 10A:
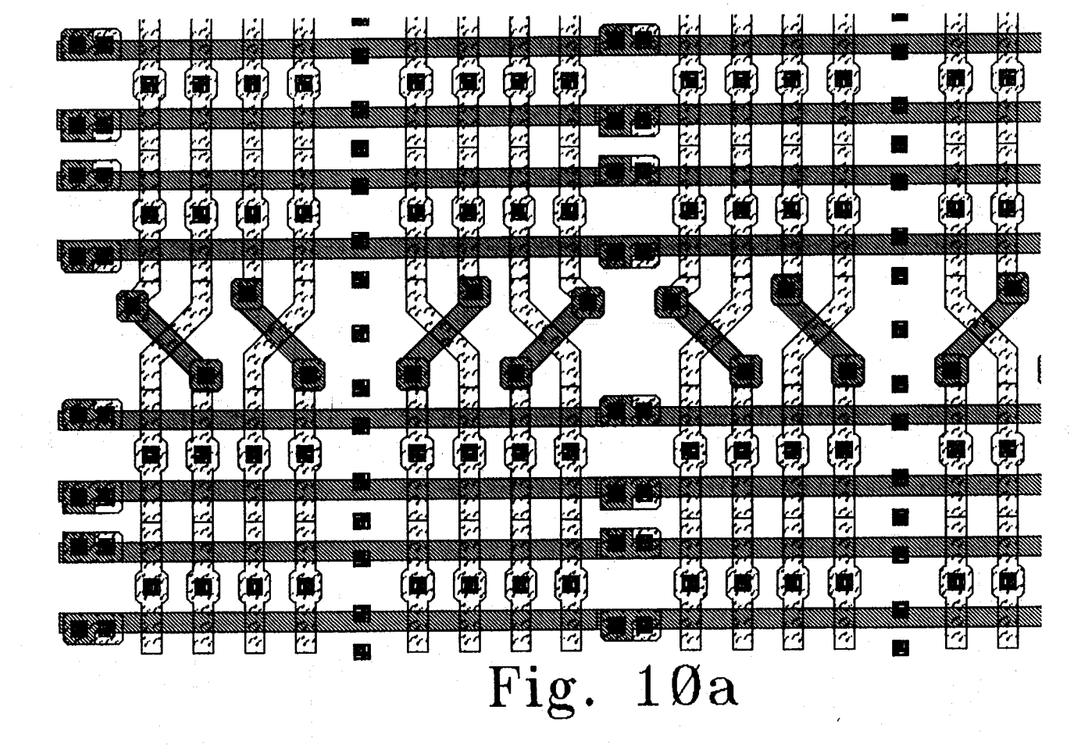
FIGS. 10a–d are ROM memory cell layouts.
Figure 10B:
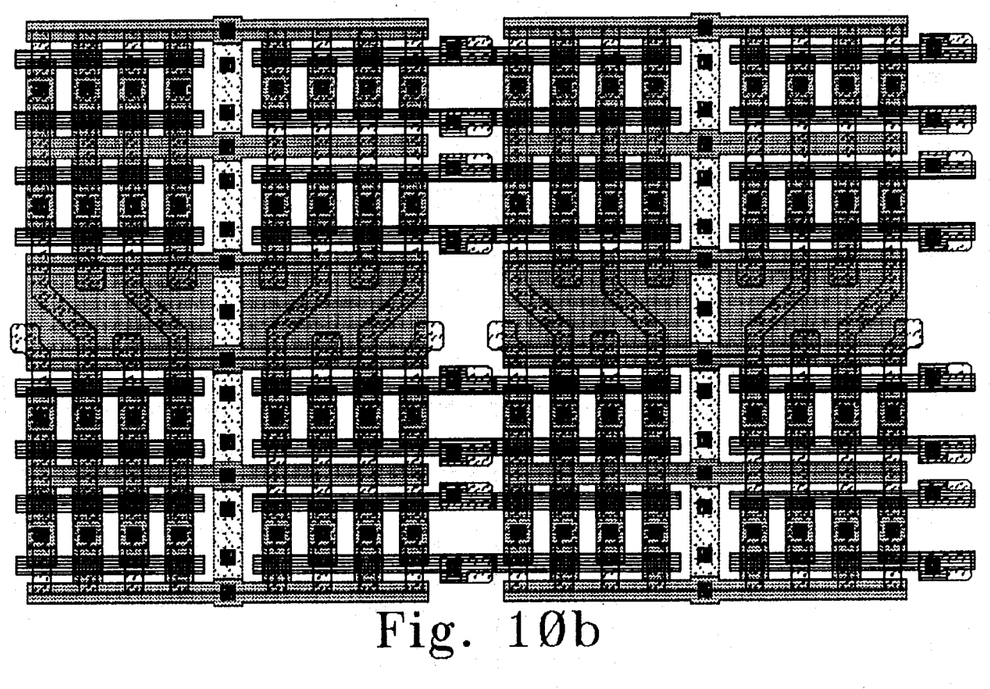
Figure 10C:
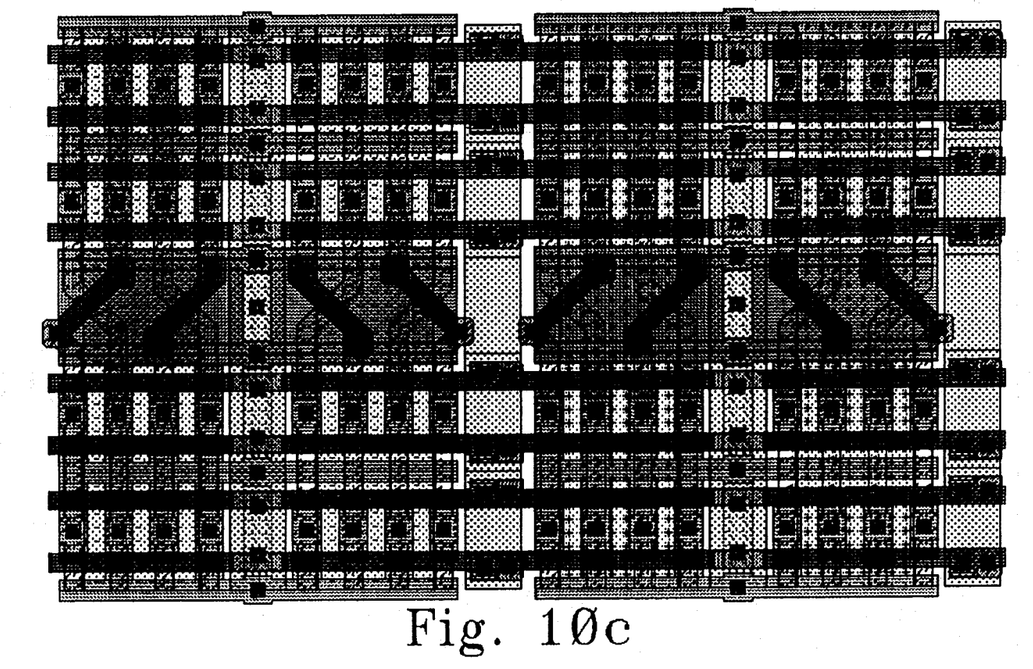
Figure 10D:
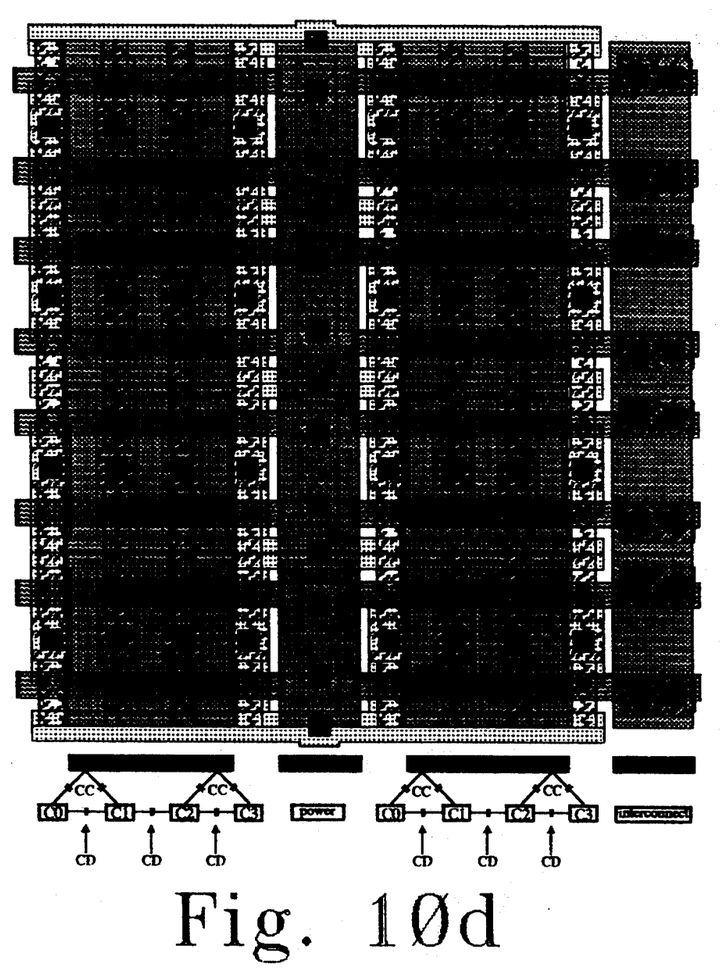

FIGS. 10a-c show the layout of some cells in ROM 300 with the vertical columns pairwise crossing in the center band of FIG. 10a to reduce differential coupling capacitances. Also, the horizontal row lines in FIG. 10a are periodically tapped to connect to the gates of groups of eight cells which are either transistors or not according to programming. This periodic tapping of the row line lessens the RC time constant across the row. And FIG. 10d is a plan view plus cross sectional elevation view showing the first and third metal levels. The power and data run in third level metal above the columns. The capacitance from the columns to power lines is labelled CC and contributed to the common mode coupling. The capacitance from column to column is labelled CD and contributes to the differential coupling. Placing the power lines in third level metal above the columns reduces the value of CD while increasing the common mode coupling to the power supply with the addition of CC. Also, the third level metal protects the columns from irregularities in coupling introduced by plastic packaging.

What is claimed:

1. An integrated circuit read only memory for storing two signal types, comprising:
   (a) a first plurality of memory cells, including first reference cells;
   (b) a second plurality of memory cells, including second reference cells; and
   (c) a differential sense amplifier with a first input coupled to cells of said first plurality and a second input coupled to cells of said second plurality;
   (d) wherein a signal of the first type is indicated in said first plurality of memory cells by the absence of a current carrying device and the activation of one of said second reference cells so that the rate of change of voltage across said one second reference cell is greater than the rate of change of voltage across said first plurality of memory cells, and indicated in said second plurality of memory cells by the presence of a current carrying device and the activation of one of said first reference cells so that the rate of change of voltage across said one first reference cell is less than the rate of change of voltage across said second plurality of memory cells.

2. The read only memory of claim 1, wherein:
   (a) said first plurality is arranged into first rows and first columns with said first columns coupled at first ends to said first input;
   (b) said second plurality is arranged into second rows and second columns with said second columns coupled at second ends to said second input;
   (c) the ends of said first columns remote from said first ends contain said first reference cells; and
   (d) the ends of said second columns remote from said second ends contain said second reference cells.

3. The read only memory of claim 2, wherein:
   (a) a power distribution line has an "H" shape with legs parallelling said colunms and with one leg providing both power crossing said ROM plus power feeding through the "H" cross link to the other leg which provides power to said ROM at multiple points along said other leg, wherein said cross link lies between said first and second pluralities.

4. The read only memory of claim 3, wherein:
   (a) said legs lie over said columns with said columns formed in a first metal level and said legs formed in a third metal level.

5. A read only memory, comprising:
   (a) a first linear array of memory cells with a cell encoding a "1" by the presence of a pulldown device connected to a first column line and encoding a "0" by the absence of a pulldown device;
   (b) a second linear array of memory cells with a cell encoding a "1" by the absence of a pulldown device connected to said first column line and encoding a "0" by the presence of a pulldown device, said first and second linear arrays being colinear;
   (c) a differential amplifier between said first and second linear arrays with a first input coupled to said first array and a second input coupled to said second array;
   (d) precharge circuitry connected to said first column line between said first input and said first array;
   (e) precharge circuitry connected to said first column line between said second input and said second array.

6. The memory of claim 5, wherein:
   (a) said first and second arrays each has a reference pulldown device connected at an end remote from said precharge circuitry.

7. The memory of claim 5, wherein:
   (a) said first input couples to said first array through a first multiplexer; and
   (b) said second input couples to said second array through a second multiplexer.

8. The memory of claim 5, further comprising:
   (a) timing circuitry which drives said differential amplifier prior to said first and second arrays being pulled down.

9. The memory of claim 5, wherein:
   (a) said first and second arrays cross pairwise and thereby reduce differential coupling capacitance.

10. An integrated circuit read only memory for storing two signal types, comprising:
    a first plurality of memory cells arranged in first rows and first columns;
    a second plurality of memory cells arranged in second rows and second columns;
    a differential sense amplifier with a first input coupled to cells of said first plurality and a second input coupled to cells of said second plurality,
    wherein a signal of the first type is indicated in said first plurality of memory cells by the absence of a current carrying device and indicated in said second plurality of memory cells by the presence of a current carrying device; and
    a power distribution line having an H shape with legs generally parallel to said first and second columns and a cross link between said first and second pluralities.

11. The read only memory of claim 10 wherein one leg provides power across the read only memory and to said cross link that, in turn, provides power to the other said leg for generally symmetrical distribution to multiple points on said other leg.

12. An integrated circuit read only memory for storing two signal types, comprising:
    a first plurality of memory cells in a first column, including a first reference cell;
    a second plurality of memory cells in a second column, including a second reference cell; and
    a differential sense amplifier with a first input coupled to said first column and a second input coupled to said second column, one of the signal types being indicated at said differential sense amplifier by grounding one said cell in one said column and activating said reference cell in the other said column, the other signal type being indicated at said differential sense amplifier by not grounding any said cell in said one column and activating said reference cell in the other said column.

13. An integrated circuit read only memory for storing two signal types, comprising:
   a first column of memory cells, said first column having a first reference cell;
   a second column of memory cells, said second column having a second reference cell; and
   a differential sense amplifier with a first input coupled to said first column and a second input coupled to said second column, the signal type being indicated at said differential sense amplifier by comparing the rate of change in voltage across said reference cell in one said column relative to the rate of change in voltage across said memory cells in the other said column.

14. The read only memory of claim 13 wherein a first signal type is indicated by a rate of change in voltage across said memory cells that is greater than the rate of change in voltage across said reference cell, and a second signal type is indicated by a rate of change in voltage across said memory cells that is less than the rate of change in voltage across said reference cell.

15. The read only memory of claim 14 further comprising means for symmetrically distributing power to said memory cells and to said reference cells in said first and second columns.

16. A method of storing two signal types in an integrated circuit read only memory comprising the steps of:
   providing a first column of memory cells in which a first signal type is indicated by the absence of a current carrying device and a second signal type is indicated by a the presence of a current carrying device, the first column having a first reference cell;
   providing a second column of memory cells in which the first signal type is indicated by the presence of a current carrying device and the second signal type is indicated by a the absence of a current carrying device, the second column having a second reference cell;
   coupling a first input of a differential sense amplifier to the first column and coupling a second input of the differential sense amplifier to the second column; and
   indicating the signal type at the differential sense amplifier by comparing the change in voltage across the reference cell in one column relative to the change in voltage across the memory cells in the other column.

17. The memory of claim 5, further comprising a power distributor for distributing power so that the same voltage is applied on either side of said differential amplifier.

18. The memory of claim 17 wherein said power distributor is H shaped.

* * * * *